(12) United States Patent
Lan et al.

(10) Patent No.: US 11,404,345 B2
(45) Date of Patent: Aug. 2, 2022

(54) ADVANCED INTEGRATED PASSIVE DEVICE (IPD) WITH THIN-FILM HEAT SPREADER (TF-HS) LAYER FOR HIGH POWER HANDLING FILTERS IN TRANSMIT (TX) PATH

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 198 days.

(21) Appl. No.: 16/898,096

(22) Filed: Jun. 10, 2020

(65) Prior Publication Data

US 2021/0391234 A1 Dec. 16, 2021

(51) Int. Cl.
  *H01L 23/36* (2006.01)
  *H01L 21/48* (2006.01)
  *H01L 23/367* (2006.01)
  *H01L 23/373* (2006.01)

(52) U.S. Cl.
  CPC ...... *H01L 23/3672* (2013.01); *H01L 21/4882* (2013.01); *H01L 23/3738* (2013.01)

(58) Field of Classification Search
  CPC ............. H01L 23/3672; H01L 21/4882; H01L 23/3738; H01L 23/5227; H01L 23/528; H01L 21/76877; H01L 21/283; H01L 23/5222; H01L 23/522; H01L 27/01; H01L 23/5329; H01L 28/10; H01L 23/5283; H01L 23/5223

USPC .......................................................... 257/712
See application file for complete search history.

(56) References Cited

U.S. PATENT DOCUMENTS

| 9,023,688 | B1 | 5/2015 | Or-Bach et al. |
| 9,893,048 | B2 | 2/2018 | Lan et al. |
| 10,453,774 | B1* | 10/2019 | Liu ......... H01L 24/17 |
| 2006/0292741 | A1 | 12/2006 | Tseng et al. |
| 2009/0170242 | A1* | 7/2009 | Lin ......... H01L 23/64 |
| | | | 438/107 |
| 2015/0084206 | A1 | 3/2015 | Lin |
| 2015/0287677 | A1* | 10/2015 | Lan ......... H01L 23/522 |
| | | | 257/532 |
| 2016/0181174 | A1 | 6/2016 | Gambino et al. |

(Continued)

FOREIGN PATENT DOCUMENTS

WO 0178141 A2 10/2001

OTHER PUBLICATIONS

International Search Report and Written Opinion—PCT/US2021/030697—ISA/EPO—dated Sep. 6, 2021.

*Primary Examiner* — Didarul A Mazumder
(74) *Attorney, Agent, or Firm* — Qualcomm Incorporated

(57) ABSTRACT

A semiconductor package is described. The semiconductor package includes a passive substrate and a first integrated passive device (IPD) in a first interlayer-dielectric (ILD) layer on the passive substrate. The semiconductor package also includes a second ILD layer on the first ILD layer. The semiconductor package further includes a second IPD in a third ILD layer on the second ILD layer. The semiconductor package also includes a thermal mitigation structure on inductive elements of the second IPD.

18 Claims, 9 Drawing Sheets

(56) References Cited

U.S. PATENT DOCUMENTS

2016/0181242 A1 6/2016 Yook et al.
2019/0067164 A1 2/2019 Noma et al.

\* cited by examiner

US 11,404,345 B2

ADVANCED INTEGRATED PASSIVE DEVICE (IPD) WITH THIN-FILM HEAT SPREADER (TF-HS) LAYER FOR HIGH POWER HANDLING FILTERS IN TRANSMIT (TX) PATH

BACKGROUND

Field

Aspects of the present disclosure relate to integrated circuits and, more particularly, to an advanced integrated passive device (IPD) having a thin-film heat spreader (TF-HS) layer for enabling high power handling radio frequency (RF) filters in a transmit (TX) path of a wireless communications device.

Background

A three-dimensional (3D) package may contain two or more chips (e.g., integrated circuits (ICs)) stacked to occupy less floor space and/or have greater connectivity. Heat dissipation is increasingly problematic for high end chips that use die stacking. In particular, stacking two or more chips may lead to localized thermal hot spots. As the localized thermal hot spots are embedded in the stack-up, this may reduce the ability to cool the hot spots and achieve low junction temperatures. Conventional cooling solutions for achieving low junction temperatures include heat sinks, heat spreaders, and/or improved printed circuit boards. Conventional techniques of simply increasing the size of the heat spreader and/or the heat sink are impractical in small form factor devices (e.g., smartphones).

The design of complex system-on-chips (SoCs) may be affected by communications enhancements, such as fifth generation (5G) new radio (NR) technologies. For example, an increased number of communication bands are specified for supporting 5G NR communications. Supporting these additional communication bands involves cramming additional devices in a reduced package size, resulting in high junction temperatures. Unfortunately, performance of complex SoCs designed to support 5G NR communications may be detrimentally affected by high junction temperatures.

SUMMARY

A semiconductor package is described. The semiconductor package includes a passive substrate and a first integrated passive device (IPD) in a first interlayer-dielectric (ILD) layer on the passive substrate. The semiconductor package also includes a second ILD layer on the first ILD layer. The semiconductor package further includes a second IPD in a third ILD layer on the second ILD layer. The semiconductor package also includes a thermal mitigation structure on inductive elements of the second IPD.

A method for fabricating a thermal mitigation structure in a semiconductor package is described. The method includes forming a first integrated passive device (IPD) in a first interlayer-dielectric (ILD) layer on a passive substrate. The method also includes depositing a second ILD layer on the first ILD layer. The method further includes forming a second IPD in a third ILD layer on the second ILD layer. The method further includes depositing a thin-film heat spreader (TF-HS) layer on inductive elements of the second IPD.

A semiconductor package is described. The semiconductor package includes a passive substrate and a first integrated passive device (IPD) in a first interlayer-dielectric (ILD) layer on the passive substrate. The semiconductor package also includes a second ILD layer on the first ILD layer. The semiconductor package further includes a second IPD in a third ILD layer on the second ILD layer. The semiconductor package also includes means for thermally dissipating heat from inductive elements of the second IPD.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
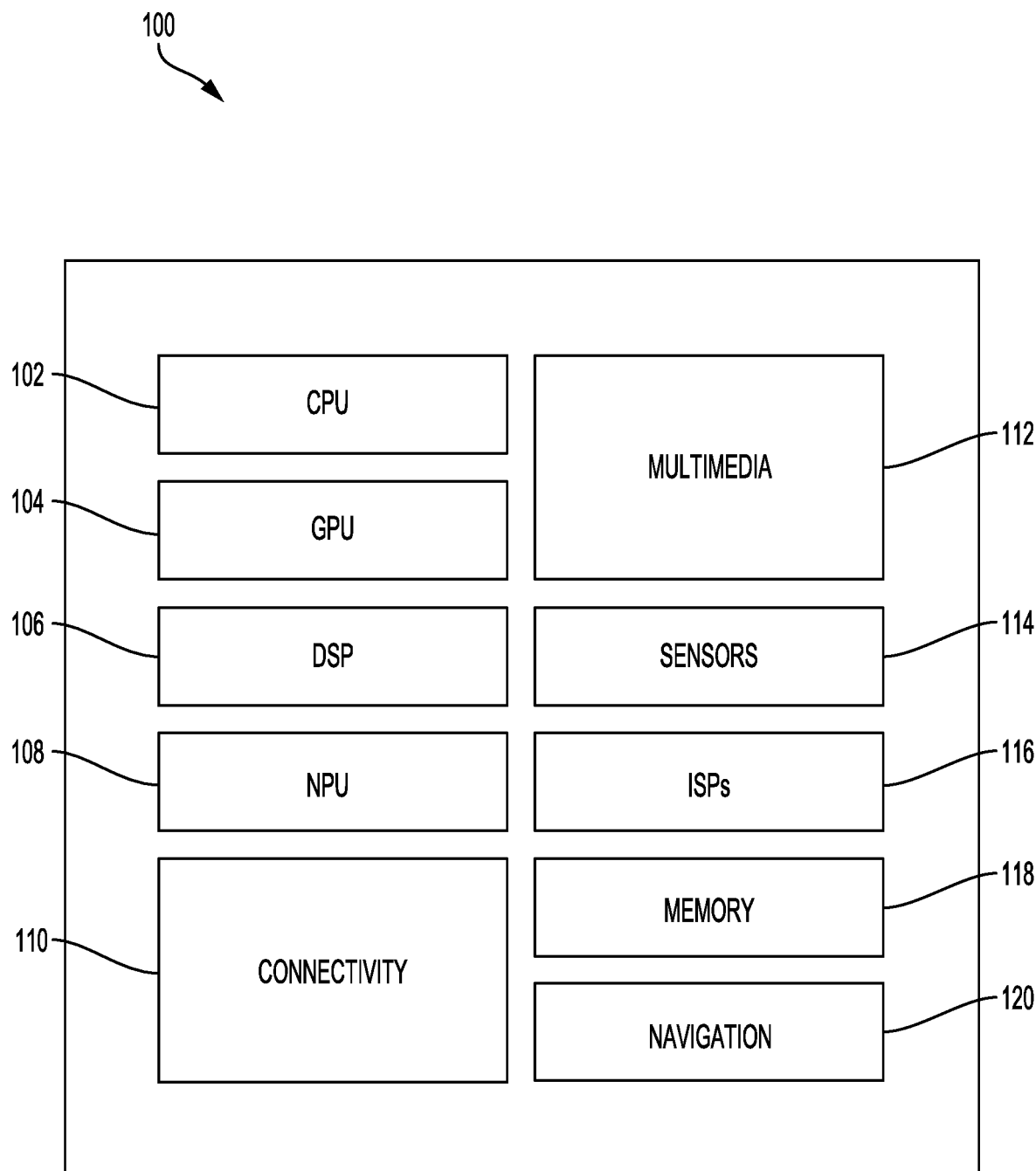
FIG. 1 illustrates an example implementation of a system-on-a-chip (SoC), including an advanced integrated passive device (IPD) having a thin-film heat spreader (TF-HS) layer, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

Heat dissipation is increasingly becoming an issue for high end chips that use die stacking, such as within a complex system-on-a-chip (SoC) package. In particular, stacking two or more chips may lead to localized thermal hot spots. As the localized thermal hot spots are embedded in the stack-up, this may reduce the ability to cool the hot spots and achieve low junction temperatures. Conventional cooling solutions for achieving low junction temperatures include heat sinks, heat spreaders, and/or improved printed circuit boards. Conventional techniques of increasing the size of the heat spreader and/or the heat sink are impractical in small form factor devices (e.g., smartphones).

The design of complex SoC packages may be affected by communications enhancements, such as 5G NR technologies. For example, an increased number of communication bands are specified for supporting 5G NR communications. Supporting these additional communication bands involves cramming additional devices in a reduced package size, resulting in high junction temperatures. Unfortunately, performance of complex SoC packages designed to support 5G NR communications may be detrimentally affected by high junction temperatures.

These SoC packages may include radio frequency (RF) integrated passive devices (IPD), aluminum nitride (AlN) acoustic resonators/filters, and RF micro-electromechanical system (MEMS) switches to support 5G NR communications. In practice, glass is a desired substrate material for implementing these RF devices because glass achieves low insertion loss as compared with a semiconductor (e.g., silicon) substrate. Unfortunately, glass exhibits the intrinsic drawback of low thermal conductivity (e.g., ~1.9 W/Ko-m vs. silicon of 150 W/Ko-m).

The low thermal conductivity of glass limits the application of RF integrated devices built on a glass substrate from handling high power due to poor heat dissipation. This is undesirable when a hot spot is localized within the RF integrated device (e.g., an RF filter used in the transmit (TX) path). In operation, a glass substrate cannot properly dissipate heat to reduce the local hot spot temperature. Thus, use of a glass substrate in an RF integrated device reduces the thermal reliability of the device, and may eventually lead to package failure.

Aspects of a previous disclosure replace glass with an alumina ceramic substrate. In practice, an alumina ceramic substrate exhibits a low loss tangent, while providing a high thermal conductivity (e.g., 30 times higher than a glass substrate). A higher thermal conductive alumina substrate can provide better thermal dissipation for RF devices that handle high power. Unfortunately, the heat may remain trapped by low thermal conductive interlayer-dielectric (ILD) layers (e.g., polyimide (PI), polybenzoxazole (PBO), or benzocyclobuten (BCB).

Various aspects of the present disclosure provide an advanced integrated passive device (IPD) having a thin-film heat spreader (TF-HS) layer. The process flow for fabricating the advanced IPD having a TF-HS layer may include wafer level process (WLP) technology. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As described, the term "laminate" may refer to a multilayer sheet to enable packaging of an IC device. The terms "substrate," "wafer," and "laminate" may be used interchangeably. Similarly, the terms "chip" and "die" may be used interchangeably.

Aspects of the present disclosure describe a thermal mitigation structure for advanced IPDs. In aspects of the present disclosure, a TF-HS layer is coated on (or underneath) the heated inductive elements of an RF package, including an RF integrated device. A TF-HS layer can significantly reduce the temperature generated in integrated inductor-capacitor (LC) passive devices built on a substrate material (e.g., silicon, glass, alumina, or other like substrate material). In one configuration, a TF-HS layer is coated on hot inductors in an upper back-end-of-line (BEOL) metal layer connecting to wafer level process (WLP) balls.

FIG. 1 illustrates an example implementation of a host system-on-a-chip (SoC) 100, which includes an advanced integrated passive device (IPD) having a thin-film heat spreader (TF-HS) layer, in accordance with aspects of the present disclosure. The host SoC 100 includes processing blocks tailored to specific functions, such as a connectivity block 110. The connectivity block 110 may include fifth generation (5G) new radio (NR) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
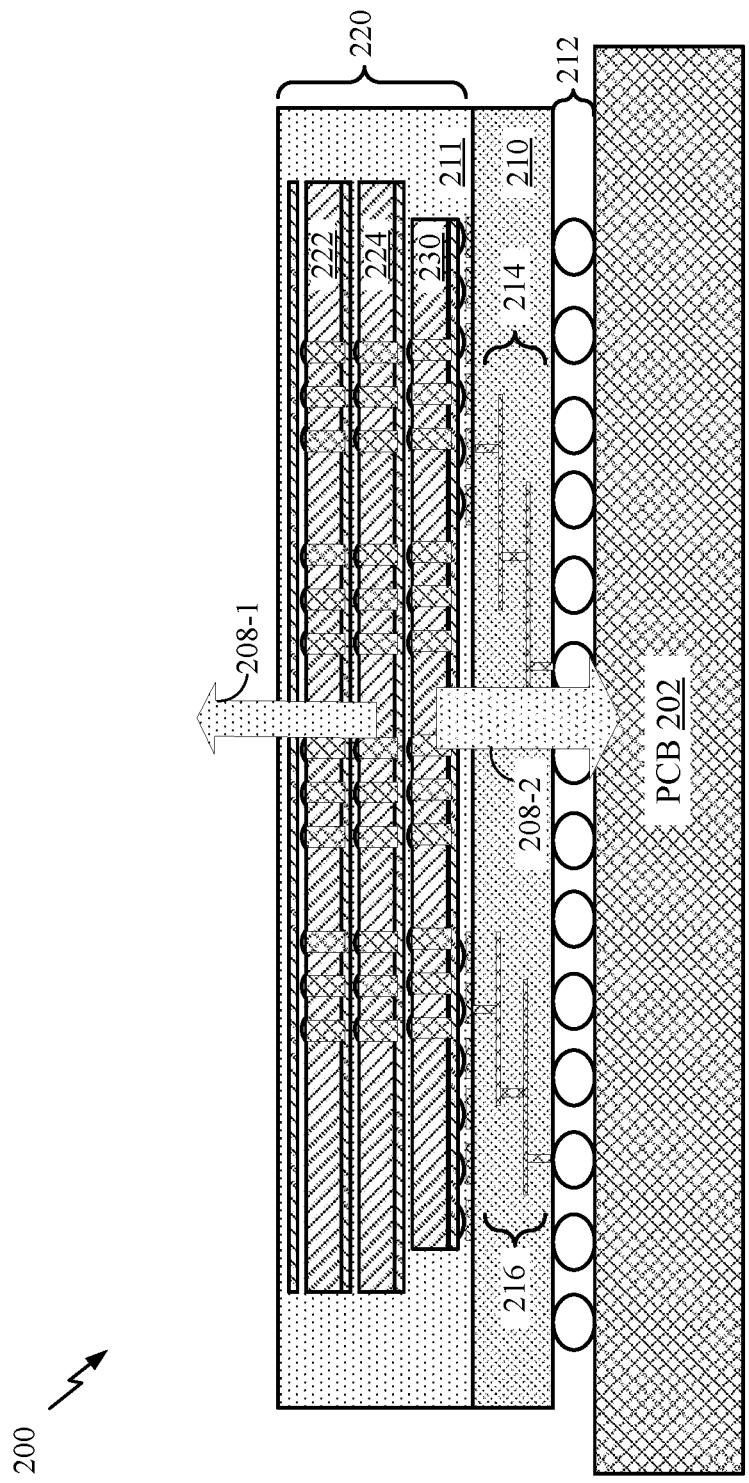
FIG. 2 shows a cross-sectional view illustrating the heat flow paths within a stacked integrated circuit (IC) package, including the system-on-a-chip (SoC) of FIG. 1.

FIG. 2 shows a cross-sectional view illustrating the main heat flow within a stacked integrated circuit (IC) package 200 of the SoC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold-compound 211. In one aspect of the present disclosure, the die 230 is the SoC of FIG. 1, including, for example, an RF package, with stacked input/output (I/O) dies 222 and 224. As indicated by the arrows 208, heat is dissipated upward (208-1) and downward (208-2) from the active devices in the 3D chip stack 220. As shown in FIG. 2, a main heat flow path is indicated by downward arrow 208-2 and a secondary heat flow path is indicated by upward arrow 208-1.

Figure 3:
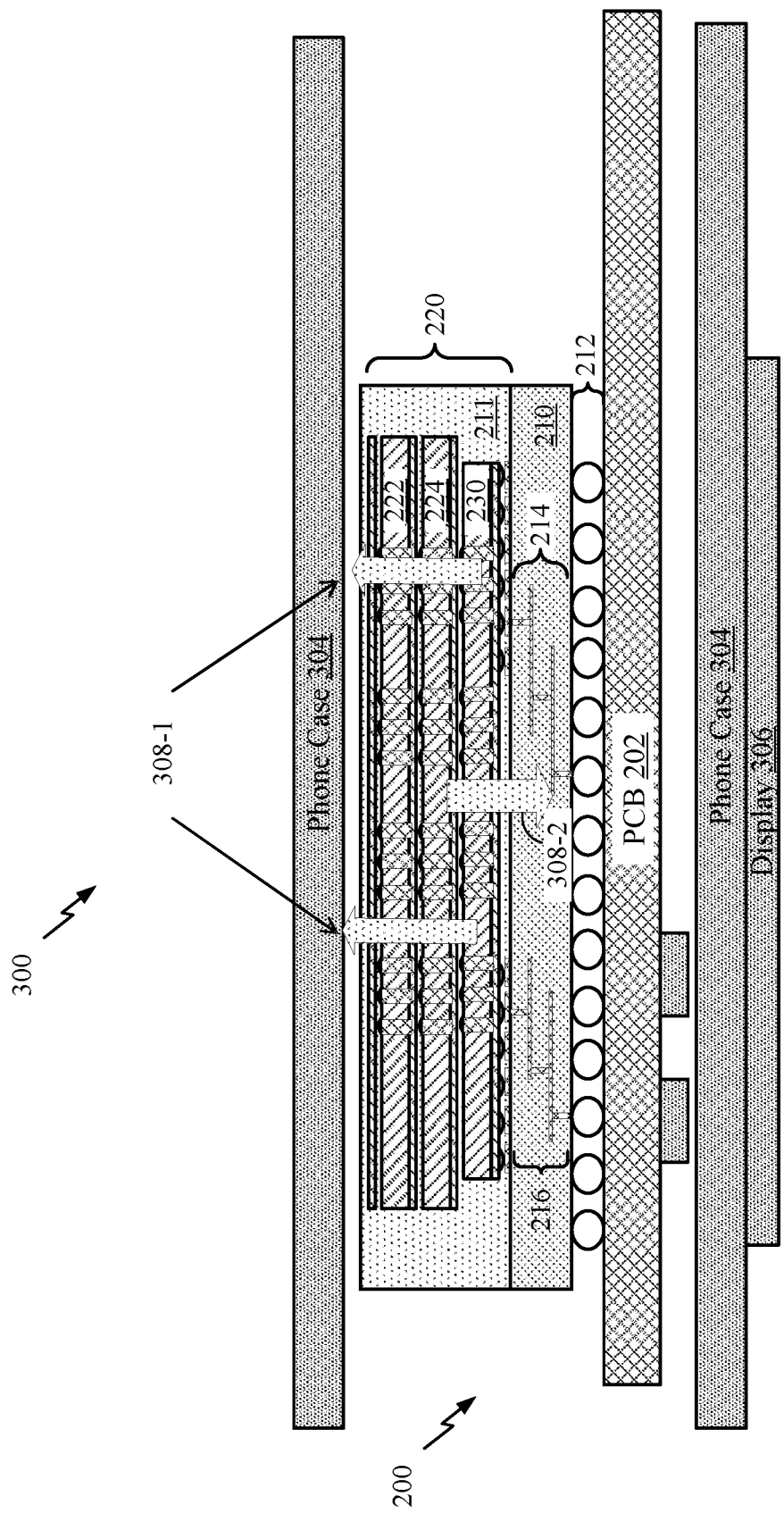
FIG. 3 shows a cross-sectional view illustrating the stacked integrated circuit (IC) package of FIG. 2, incorporated into a wireless device, according to one aspect of the present disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for 5G NR communications. Representatively, the stacked IC package 200 is placed within a phone case 304, including a display 306. In this configuration, a thin-film heat spreader (TF-HS) layer (not shown) is integrated into the stacked IC package 200. As indicated by the arrows 308, heat dissipates upwardly and downwardly from the active devices in the 3D chip stack 220. That is, heat dissipates upwardly (e.g., 308-1) and downwardly (e.g., 308-2) from the active devices within the 3D chip stack 220. In this configuration, the TF-HS layer provides an upward heat flow path indicated by the arrows 308-1 to supplement the downward heat flow path, as indicated by the arrow 308-2.

Figure 4:
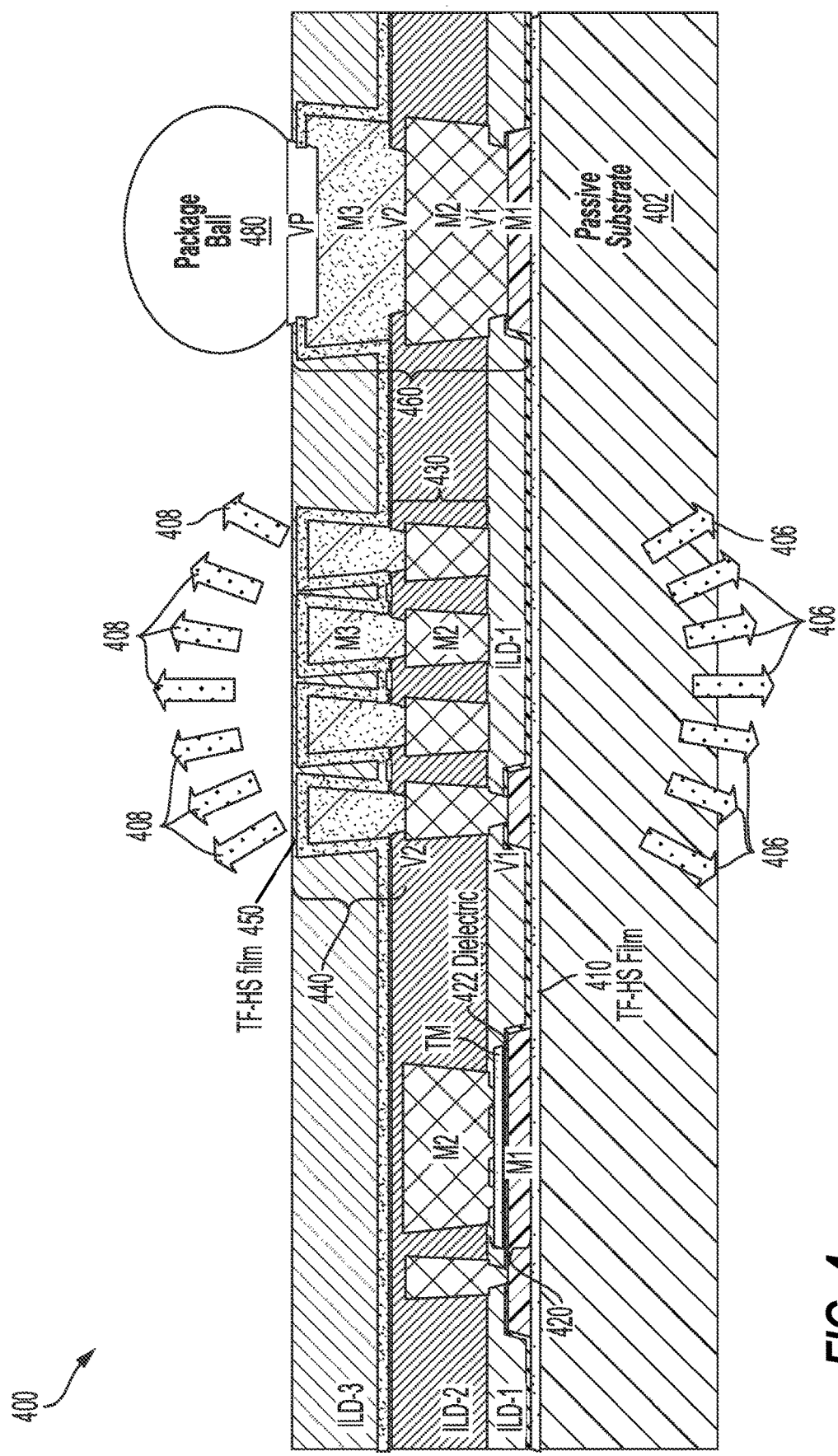
FIG. 4 is a cross-section diagram of an integrated circuit (IC) package, having a thin-film heat spreader (TF-HS) layer, according to aspects of the present disclosure.
Figure 5:
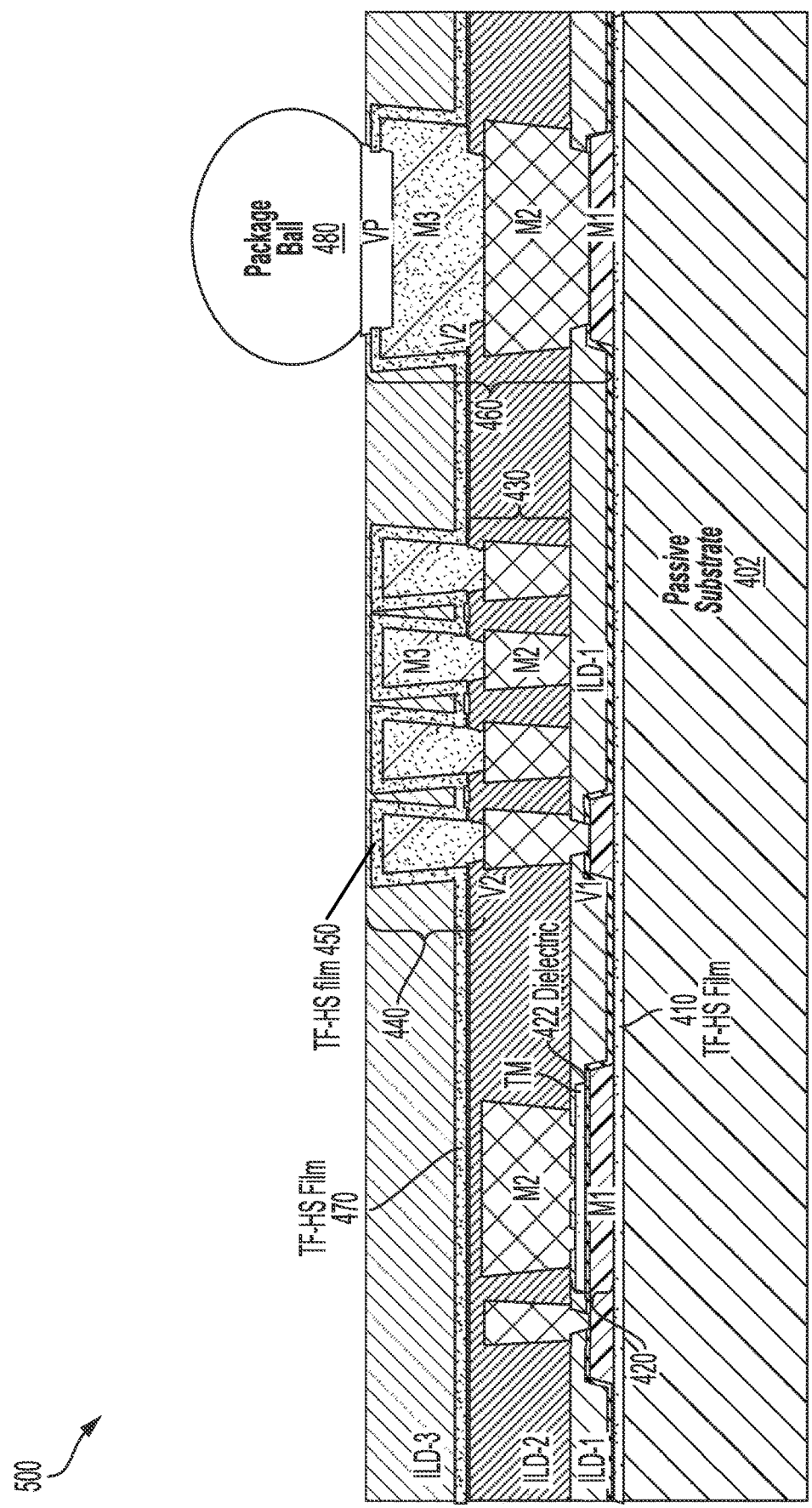
FIG. 5 is a cross-section diagram of an integrated circuit (IC) package, having thin-film heat spreader (TF-HS) layers, according to aspects of the present disclosure.
Figure 6:
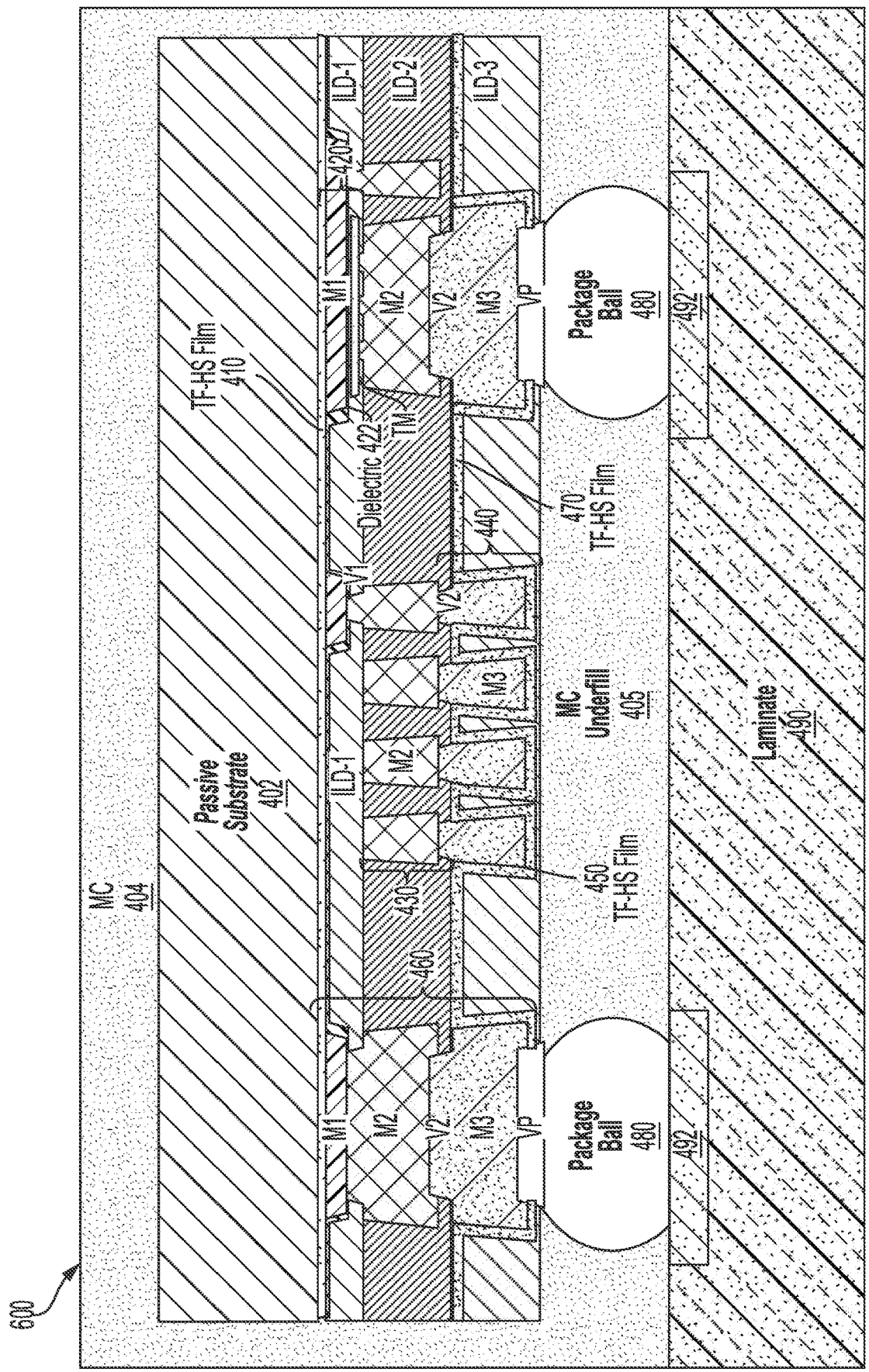
FIG. 6 is a cross-section diagram of a radio frequency (RF) chip, including the integrated circuit (IC) package of FIG. 5, having thin-film heat spreader (TF-HS) layers, according to aspects of the present disclosure

Aspects of the present disclosure are directed to a TF-HS layer on integrated passive devices in an RF package, for example, as shown in FIGS. 4-6. Although described with reference to an RF package, it should be recognized that the TF-HS layer may be incorporated into any chip package in which improved heat distribution is desired.

FIG. 4 is a cross-section diagram of an integrated circuit (IC) package 400, having a thin-film heat spreader (TF-HS) layer, according to aspects of the present disclosure. In this configuration, the IC package 400 includes a passive substrate 402 (e.g., silicon, glass, alumina, or other like substrate material). The IC package 400 also includes a first TF-HS layer 410 (e.g., aluminum nitride (AlN), silicon nitride (SiNx), chemical vapor deposition (CVD diamond or silicon carbide (SiC)) on a surface of the passive substrate 402. The IC package 400 further includes a first integrated passive device (IPD) 420 in a first back-end-of-line (BEOL) metallization layer M1 (e.g., copper (Cu), aluminum, or other like conductive material) on the passive substrate 402. According to aspects of the present disclosure, the IC package 400 may be a high power active die, such as a server die, a radio frequency (RF) die, a mobile station modem, or other like high power amplifier active device.

Design of the passive substrate 402 is generally optimized for downward thermal dissipation shown by conventional heat dissipation paths 406, which increase junction temperatures leading to decreased performance. As noted, the passive substrate 402 may be composed of a material selected from one of silicon, glass, alumina, and alumina ceramic. According to aspects of the present disclosure, placement of TF-HS layers on the surface of the passive substrate 402 and within BEOL layers on the passive substrate 402 creates thermal dissipation paths 408. The TF-HS layers may be composed of a material selected from one of aluminum nitride (AlN), silicon nitride (SiNx), chemical vapor deposition (CVD diamond, and silicon carbide (SiC) to enable the thermal dissipation paths 408. These thermal dissipation paths 408 are in opposite directions relative to the conventional heat dissipation paths 406.

In this configuration, the first IPD 420 is composed of a metal-insulator-metal (MIM) capacitor on the surface of the passive substrate 402. The first IPD 420 may include a first BEOL metallization layer M1 as a first terminal, a dielectric layer (e.g., silicon nitride (SiNx), tantalum oxide (Ta2O5), etc.) on the metallization layer M1, and a thick metal (TM) on a dielectric layer 422 as a second terminal. In this example, the metallization layer M1 is secured to the first TF-HS layer 410 and within a first interlayer-dielectric (ILD) layer (ILD-1) on the surface of the first TF-HS layer 410. In addition, a second BEOL metallization layer M2 is coupled to the second terminal of the first IPD 420. The second metallization layer M2 is within a second ILD layer (ILD-2) on the first ILD layer (ILD-1).

As further shown in FIG. 4, the IC package 400 includes a second IPD 440 formed from metallization routing layers. In this configuration, the second IPD 440 is an inductor, including a third BEOL metallization layer M3 stacked on second metallizations 430 through vias V2. In aspects of the present disclosure, a second TF-HS layer 450 is coated on (or underneath) the heated inductive elements of the second IPD 440. In this configuration, the second TF-HS layer 450 is coated on a third BEOL metallization layer M3 coupled to a package ball 480 (e.g., a wafer level process (WLP) ball through a via pad (VP). The second TF-HS layer 450 is on sidewalls and a portion of a surface of the metallization layer M3, and on sidewalls of the via pad VP. The via pad VP is on a metallization stack 460, including the metallization layer M3 on a second metallization via V2, the second metallization layer M2 on a first metallization via V1, and on the first metallization layer M1.

The first TF-HS layer 410 and the second TF-HS layer 450 can significantly reduce the temperature generated in integrated inductor-capacitor (LC) passive devices of the IC package 400. The first TF-HS layer 410 and the second TF-HS layer 450 provide a thermal mitigation structure to enable formation of the first IPD 420 and the second IPD 440 built on a variety of substrate materials (e.g., silicon, glass, alumina, or other like substrate material). Although shown on different layers of the IC package 400, it should be recognized that the first IPD 420 and the second IPD 440 may be formed in the same interlayer-dielectric (ILD) layer or different ILD layers, as shown in FIG. 4. The thermal mitigation structure of the IC package 400 may be further improved, as shown in FIG. 5

FIG. 5 is a cross-section diagram of an integrated circuit (IC) package 500, having thin-film heat spreader (TF-HS) layers, according to aspects of the present disclosure. In this configuration, the IC package 500 also includes the passive substrate 402, having the first TF-HS layer 410 on the surface of the passive substrate 402. The IC package 500 further includes the first IPD 420, having the first metallization layer M1 as a plate of a metal-insulator-metal (MIM) capacitor. According to aspects of the present disclosure, the IC package 500 may be a high power active die, such as a server die, a radio frequency (RF) die, a mobile station modem, or other like high power active device. The IC package 500 further includes a third TF-HS layer 470 between the first interlayer-dielectric (ILD) layer (ILD-1) and the second ILD layer (ILD-2). The third TF-HS layer 470 on the surface of the second ILD layer (ILD-2) improves the thermal dissipation paths 408 shown in FIG. 4.

The first ILD layer (ILD-1), the second ILD layer (ILD-2), and the third ILD layer (ILD-3) may be composed of a low thermal conductive ILD material. For example, a low thermal conductive ILD material may be a layer of polyimide (PI), polybenzoxazole (PBO), benzocyclobuten (BCB), or other like low thermal conductive ILD material. In operation, heat may remain trapped by the ILD layers (e.g., ILD-1, ILD-2, and IDL-3) of the IC package 500 due to the low thermal conductive ILD material. In aspects of the present disclosure, the second TF-HS layer 450 and the third TF-HS layer 470 improve dissipation of heat trapped by the ILD layers (e.g., ILD-1, ILD-2, and IDL-3) of the IC package 500.

As further shown in FIG. 5, the IC package 500 includes an inductor of the second IPD 440, composed of the third metallization layer M3 stacked on second metallizations 430 through vias V2. The second TF-HS layer 450 is also coated on the heated inductive elements of the second IPD 440. In this configuration, the second TF-HS layer 450 is coated on the third metallization layer M3 coupled to a package ball 480 through the via pad VP. The via pad VP is also on the metallization stack 460.

FIG. 6 is a cross-section diagram of a radio frequency (RF) chip 600, including the IC package 500 of FIG. 5, having thin-film heat spreader (TF-HS) layers, according to aspects of the present disclosure. In this configuration, the IC package 500 is encapsulated in a mold-compound 404 (MC), including a mold-compound underfill 405, between the IC package 500 and a laminate substrate 490 to form the RF chip 600. The mold-compound 404 may be a filled epoxy resin (e.g., G311Q-L) deposited on the surface of the laminate substrate 490 and the IC package 500, with the mold-compound underfill 405 between the package balls 480 coupled to the IC package 500 to pads 492 of the laminate substrate 490. As shown in FIG. 6, the terminal conductive structure provided by the first TF-HS layer 410, the second TF-HS layer 450, and the third TF-HS layer 470 improves dissipation of trapped heat. For example, heat generated by the mold-compound 404, the passive substrate 402, the interlayer-dielectric (ILD) layers (e.g., ILD-1, ILD-2, and ILD-3), and the mold-compound underfill 405 is dissipated by the thermal conductive structure of the RF chip 600.

Figure 7:
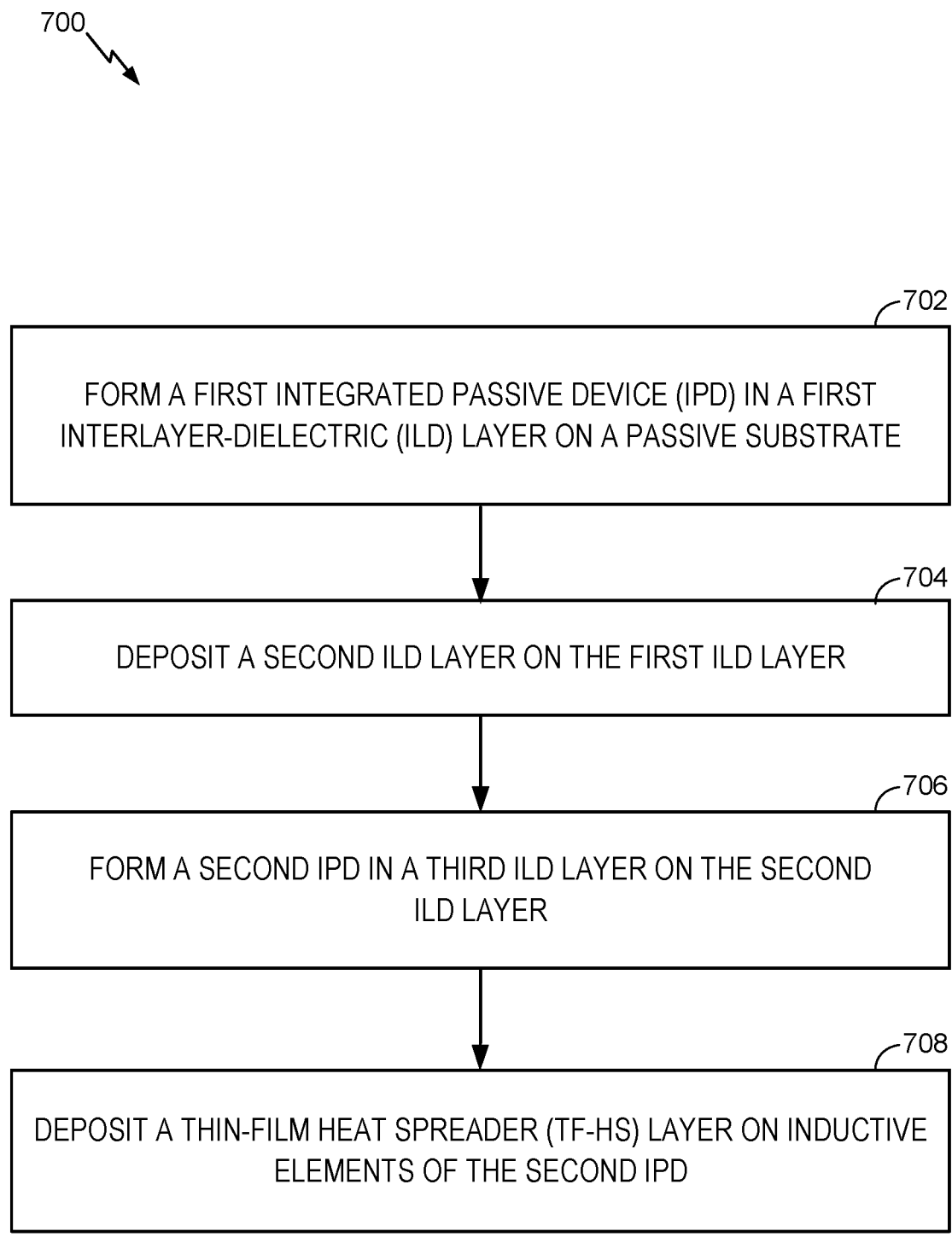
FIG. 7 is a process flow diagram illustrating a method for fabricating a thermal mitigation structure in a semiconductor package, according to an aspect of the present disclosure.

FIG. 7 is a process flow diagram illustrating a method for fabricating a thermal mitigation structure in a semiconductor package, according to an aspect of the present disclosure. A method 700 begins in block 702, in which a first integrated passive device (IPD) is formed in a first interlayer-dielectric (ILD) layer on a passive substrate. For example, as shown in FIG. 4, the first IPD 420 is composed of a metal-insulator-metal (MIM) capacitor on the surface of the passive substrate 402. The first IPD 420 includes the metallization layer M1 as a first terminal, a dielectric layer 422 on the metallization layer M1, and a thick metal (TM) on the dielectric layer 422 as a second terminal. At block 704, a second ILD layer is deposited on the first ILD layer. For example, as shown in FIG. 4, the second ILD layer (ILD-2) is deposited on the first ILD layer (ILD-1).

At block 706, a second IPD is formed in a third ILD layer (ILD-3) on the second ILD layer (ILD-2). For example, as shown in FIG. 4, the IC package 400 includes a second IPD 440 formed from metallization routing layers. In this configuration, the second IPD 440 is an inductor, including a third back-end-of-line (BEOL) metallization layer M3 stacked on second metallizations 430 through vias V2. At block 708, a thin-film heat spreader (TF-HS) layer is deposited on inductive elements of the second IPD. For example, in FIG. 4, a second TF-HS layer 450 is coated on (or underneath) the heated inductive elements of the second IPD 440. In this configuration, the second TF-HS layer 450 is coated on a third BEOL metallization layer M3 coupled to a package ball 480 through a via pad VP. The method 700 may further include depositing a first TF-HS layer on the passive substrate. The method 700 may further include depositing a second TF-HS layer on the first ILD layer and on metallization routing layers of the second ILD layer, as shown in FIG. 4.

Aspects of the present disclosure are directed to an advanced integrated passive device (IPD) with thin-film heat spreader (TF-HS) layers to provide a thermal mitigation structure for a semiconductor package. This thermal mitigation structure is proposed to improve thermal issues to increase the power handling of the IPDs for broadband filters to deploy in a transmit (TX) path of a wireless communications device. In one configuration, a TF-HS layer (e.g., aluminum nitride (AlN), silicon nitride (SiNx), chemical vapor deposition (CVD diamond or silicon carbide (SiC), etc.) is deposited on heated inductive thick metals (TMs) of an integrated passive inductor. In addition, the thermally conductive insulating layer (AlN, SiNx, CVD diamond, or SiC) between first and second interlayer-dielectric (ILD) layers (e.g., ILD-1 and ILD-2 of FIGS. 4-6), and between the second and third ILD layers (e.g., ILD-2 and ILD-3 of FIGS. 4-6), may be effectively coated over the hot inductors on an upper metallization layer (e.g., M3) connecting to WLP balls of a semiconductor package.

According to aspects of the present disclosure, TF-HS materials (e.g., AlN, SiC, CVD Diamond, etc.) have a desired thermal conductivity and desired electrical insulation (e.g., low RF loss). Use of aluminum nitride (AlN) due to its lower temperature process is potentially advantageous for the TF-HS layer of thermal mitigation structures. In one configuration, a physical vapor deposition (PVD) of an aluminum nitride coating on the surface of an ILD layer (e.g., polyimide (PI)) may involve a plasma etch (e.g. argon (Ar)) of the surface for adhesion improvement. In another configuration, a plasma-enhanced chemical vapor deposition (PECVD) of silicon nitride (SiNx) is a potential candidate for coating on heated inductive thick metals (TMs) of an IPD.

According to a further aspect of the present disclosure, an integrated circuit (IC) semiconductor package is described. In one configuration, the IC semiconductor package has means for thermally dissipating heat from inductive elements of the second IPD. In one configuration, the heat thermally dissipating means may be the second TF-HS layer 450, as shown in FIGS. 4-6. In another aspect, the aforementioned means may be any structure or any material configured to perform the functions recited by the aforementioned means.

Figure 8:
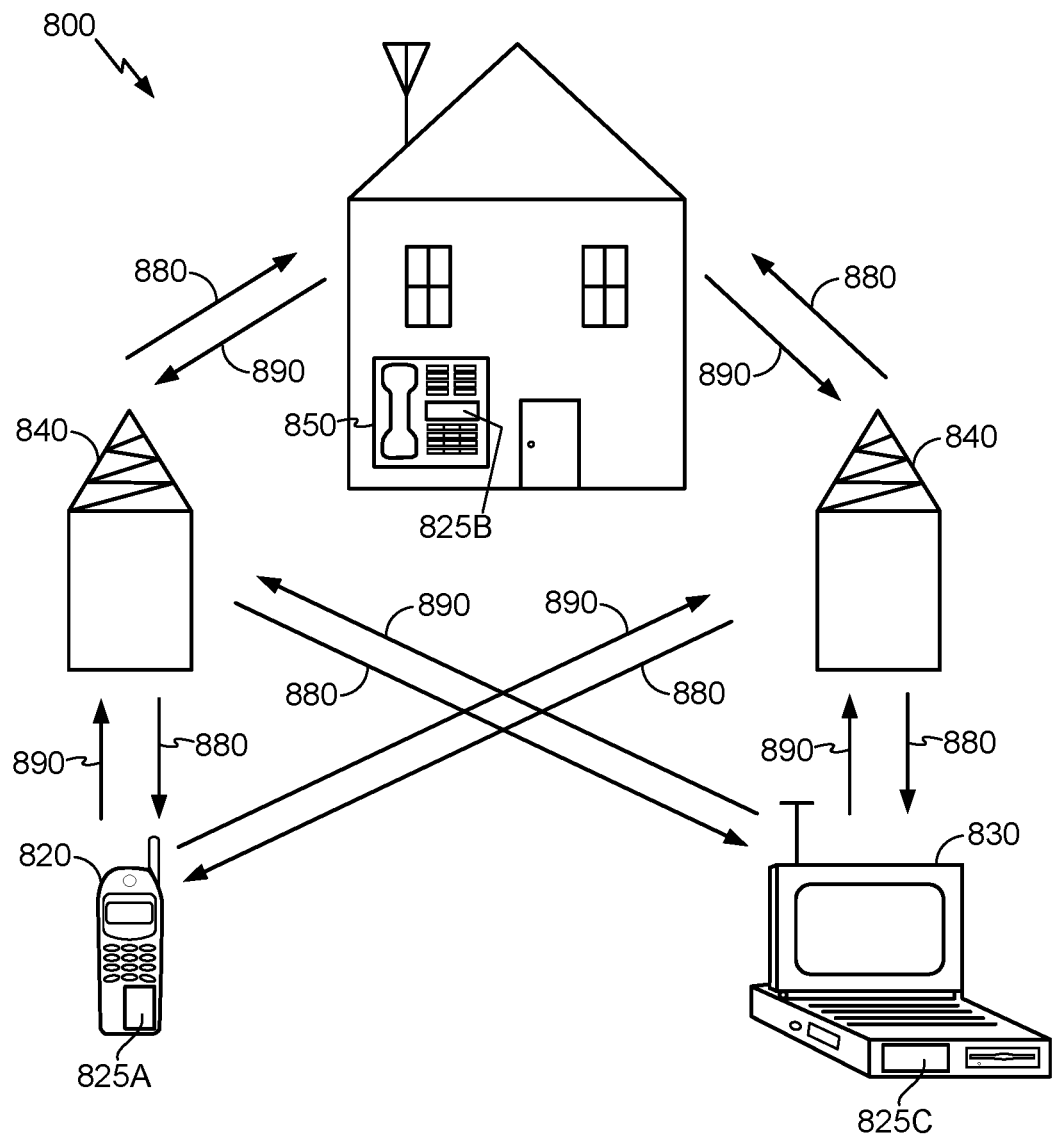
FIG. 8 is a block diagram showing an exemplary wireless communications system in which a configuration of the present disclosure may be advantageously employed.

FIG. 8 is a block diagram showing an exemplary wireless communications system 800 in which an aspect of the present disclosure may be advantageously employed. For purposes of illustration, FIG. 8 shows three remote units 820, 830, and 850, and two base stations 840. It will be recognized that wireless communications systems may have many more remote units and base stations. Remote units 820, 830, and 850 include IC devices 825A, 825B, and 825C that include the disclosed TF-HS layer. It will be recognized that other devices may also include the disclosed TF-HS layer, such as the base stations, switching devices, and network equipment. FIG. 8 shows forward link signals 880 from the base station 840 to the remote units 820, 830, and

850, and reverse link signals 890 from the remote units 820, 830, and 850 to the base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the disclosure is not limited to these exemplary illustrated units. Aspects of the present disclosure may be suitably employed in many devices, which include the disclosed TF-HS layer.

Figure 9:
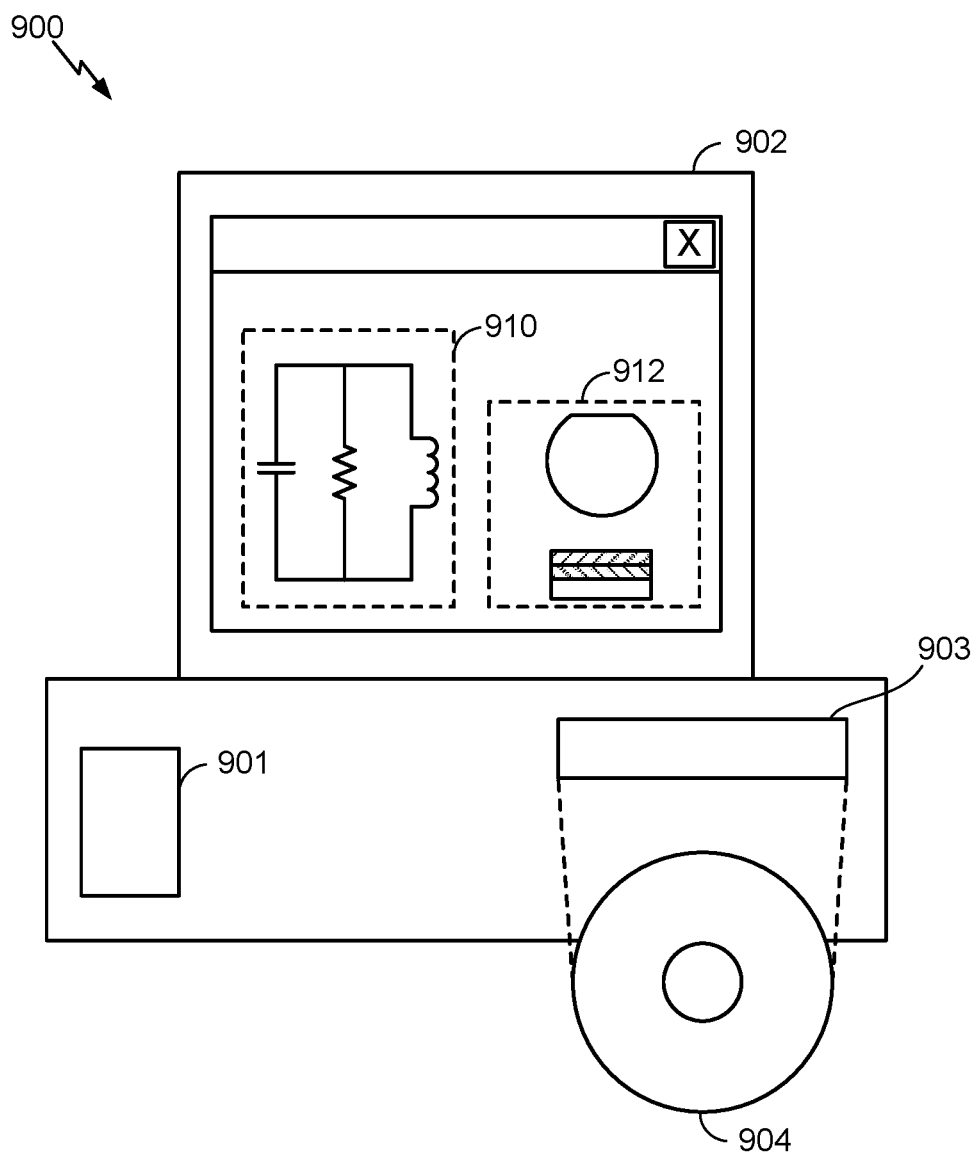
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitors disclosed above. A design workstation 900 includes a hard disk 901 containing operating system software, support files, and design software such as Cadence or OrCAD. The design workstation 900 also includes a display 902 to facilitate design of a circuit 910 or an RF component 912 including a TF-HS layer. A storage medium 904 is provided for tangibly storing the design of the circuit 910 or the RF component 912 (e.g., including the thin-film heat spreader layer). The design of the circuit 910 or the RF component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the RF component 912 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described, but is to be accorded the widest scope consistent with the principles and novel features disclosed.

What is claimed is:

1. A semiconductor package, comprising:
   a passive substrate;
   a first integrated passive device (IPD) in a first interlayer-dielectric (ILD) layer on the passive substrate;
   a second ILD layer on the first ILD layer;
   a second IPD in a third ILD layer on the second ILD layer; and
   a thermal mitigation structure on inductive elements of the second IPD,
   wherein a mold-compound encapsulates the semiconductor package,
   a package substrate has pads coupled to package balls on the semiconductor package, and
   an underfill is between the package balls and between the package substrate and the semiconductor package.

2. The semiconductor package of claim 1, in which the thermal mitigation structure comprises a thin-film heat spreader (TF-HS) layer on the second ILD layer and on metallization routing layers of the second IPD.

3. The semiconductor package of claim 1, in which the thermal mitigation structure comprises a TF-HS layer on the first ILD layer and on metallization routing layers in the second ILD layer.

4. The semiconductor package of claim 1, in which the thermal mitigation structure comprises a TF-HS layer on the passive substrate.

5. The semiconductor package of claim 1, in which the semiconductor package comprises a radio frequency (RF) die integrated into an RF chip package.

6. The semiconductor package of claim 1, in which the first IPD comprises a metal-insulator-metal (MIM) capacitor, and the second IPD comprises an inductor.

7. The semiconductor package of claim 1, in which the thermal mitigation structure comprises a TF-HS layer of a material selected from one of aluminum nitride (AlN), silicon nitride (SiNx), chemical vapor deposition (CVD) diamond, and silicon carbide (SiC).

8. The semiconductor package of claim 1, in which the passive substrate comprises a material selected from one of silicon, glass, alumina, and alumina ceramic.

9. A semiconductor package, comprising:
   a passive substrate;
   a first integrated passive device (IPD) in a first interlayer-dielectric (ILD) layer on the passive substrate;
   a second ILD layer on the first ILD layer;
   a second IPD in a third ILD layer on the second ILD layer;
   a thermal mitigation structure on inductive elements of the second IPD;
   a first thin-film heat spreader (TF-HS) layer on the passive substrate;
   a metallization stack on the first TF-HS layer;
   a package ball coupled to a metallization layer of the metallization stack through a via pad; and
   a second TF-HS layer on sidewalls and a portion of a surface of the metallization layer, and on sidewalls of the via pad.

10. A method for fabricating a thermal mitigation structure in a semiconductor package, the method comprising:
    forming a first integrated passive device (IPD) in a first interlayer-dielectric (ILD) layer on a passive substrate;
    depositing a second ILD layer on the first ILD layer;
    forming a second IPD in a third ILD layer on the second ILD layer;
    depositing a thin-film heat spreader (TF-HS) layer on inductive elements of the second IPD;
    depositing a mold-compound to encapsulate the semiconductor package;
    attaching a package substrate having pads coupled to package balls on the semiconductor package; and
    depositing an underfill between the package balls and between the package substrate and the semiconductor package.

11. The method of claim 10, further comprising:
    depositing a TF-HS layer on the second ILD layer; and
    depositing a TF-HS layer on metallization routing layers of the second IPD.

12. The method of claim 10, further comprising depositing a first TF-HS layer on the passive substrate.

13. The method of claim 12, further comprising depositing a second TF-HS layer on the first ILD layer and on metallization routing layers in the second ILD layer.

14. The method of claim 10, further comprising:
    depositing a first TF-HS layer on the passive substrate;
    forming a metallization stack on the first TF-HS layer;
    forming a package ball coupled to a metallization layer of the metallization stack through a via pad; and
    depositing a second TF-HS layer on sidewalls and a portion of a surface of the metallization layer, and on sidewalls of the via pad.

15. A semiconductor package, comprising:
    a passive substrate;
    a first integrated passive device (IPD) in a first interlayer-dielectric (ILD) layer on the passive substrate;
    a second ILD layer on the first ILD layer;
    a second IPD in a third ILD layer on the second ILD layer; and
    means for thermally dissipating heat from inductive elements of the second IPD,
    wherein a mold-compound encapsulates the semiconductor package,
    a package substrate has pads coupled to package balls on the semiconductor package, and an underfill is between the package balls and between the package substrate and the semiconductor package.

16. The semiconductor package of claim 15, in which the semiconductor package comprises a radio frequency (RF) die integrated into an RF chip package.

17. The semiconductor package of claim 15, in which the first IPD comprises a metal-insulator-metal (MIM) capacitor, and the second IPD comprises an inductor.

18. The semiconductor package of claim 15, in which the passive substrate comprises a material selected from one of silicon, glass, alumina, and alumina ceramic.

* * * * *